United States Patent
Ieong et al.

(10) Patent No.: US 7,704,839 B2
(45) Date of Patent: Apr. 27, 2010

(54) BURIED STRESS ISOLATION FOR HIGH-PERFORMANCE CMOS TECHNOLOGY

(75) Inventors: MeiKei Ieong, Wappingers Fall, NY (US); Zhibin Ren, Hopewell Junction, NY (US); Haizhou Yin, Beacon, NY (US)

(73) Assignee: International Business Machines Corporation, Armonk, NY (US)

( * ) Notice: Subject to any disclaimer, the term of this patent is extended or adjusted under 35 U.S.C. 154(b) by 67 days.

(21) Appl. No.: 12/099,195

(22) Filed: Apr. 8, 2008

(65) Prior Publication Data

US 2008/0185658 A1    Aug. 7, 2008

Related U.S. Application Data

(63) Continuation of application No. 11/183,062, filed on Jul. 15, 2005, now Pat. No. 7,384,851.

(51) Int. Cl.
*H01L 21/336* (2006.01)
(52) U.S. Cl. .............. 438/283; 257/369; 257/E21.415; 438/301

(58) Field of Classification Search .......... 438/283, 438/285, 300, 301; 257/369, E21.415, E21.633, 257/E21.637, E21.642, E21.703
See application file for complete search history.

(56) References Cited

U.S. PATENT DOCUMENTS

2006/0255330 A1* 11/2006 Chen et al. ............... 257/18

* cited by examiner

*Primary Examiner*—Walter L Lindsay, Jr.
(74) *Attorney, Agent, or Firm*—Gibb I.P. Law Firm, LLC

(57) ABSTRACT

A field effect transistor (FET) comprises a substrate; a buried oxide (BOX) layer over the substrate; a current channel region over the BOX layer; source/drain regions adjacent to the current channel region; a buried high-stress film in the BOX layer and regions of the substrate, wherein the high-stress film comprises any of a compressive film and a tensile film; an insulating layer covering the buried high-stress film; and a gate electrode over the current channel region, wherein the high-stress film is adapted to create mechanical stress in the current channel region, wherein the high-stress film is adapted to stretch the current channel region in order to create the mechanical stress in the current channel region; wherein the mechanical stress comprises any of compressive stress and tensile stress, and wherein the mechanical stress caused by the high-stress film causes an increased charge carrier mobility in the current channel region.

26 Claims, 6 Drawing Sheets

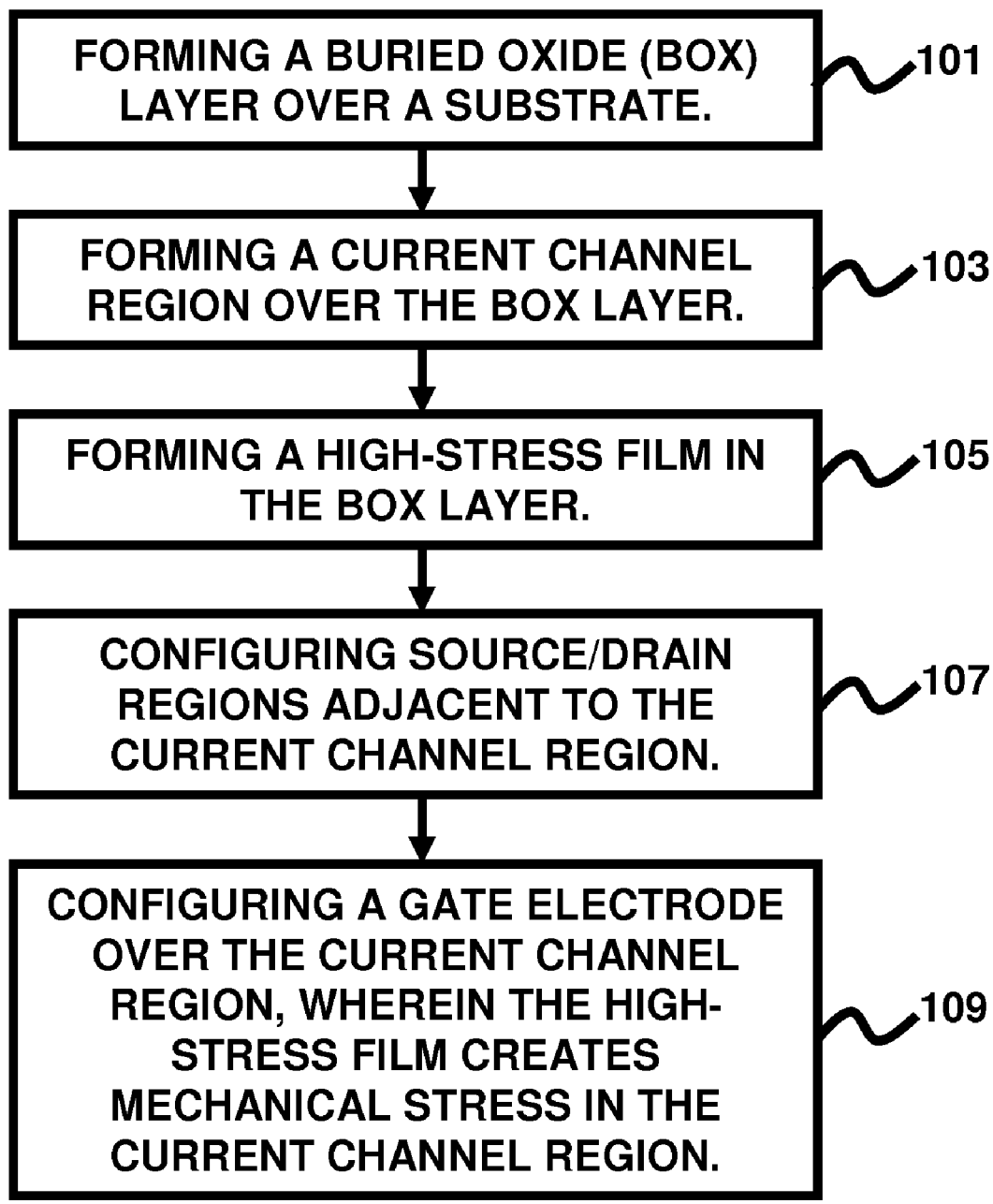

BURIED STRESS ISOLATION FOR HIGH-PERFORMANCE CMOS TECHNOLOGY

CROSS-REFERENCE TO RELATED APPLICATIONS

This application is a Continuation of U.S. application Ser. No. 11/183,062 filed Jul. 15, 2005, the complete disclosure of which, in its entirety, is herein incorporated by reference.

BACKGROUND OF THE INVENTION

1. Field of the Invention

The embodiments of the invention generally relate to integrated circuits, and, more particularly, to complementary metal oxide semiconductor (CMOS) field effect transistors (FETs).

2. Description of the Related Art

Field effect transistors (FETs) are employed in almost every electronic circuit application, such as signal processing, computing, and wireless communications. It is desirable to improve FET performance including the switching speed and on-state current capability. Such an improvement in the performance of FETs stems from enhanced carrier mobility in the FET channel regions. Some conventional techniques deposit epitaxial silicon on relaxed silicon-germanium, which has a larger lattice constant than that of relaxed silicon. However, the presence of the silicon-germanium can cause process issues in the subsequent CMOS fabrication processes, including germanium diffusion into the channels, difficulty in silicide formation, and modified dopant diffusivities, etc. These effects tend to complicate the CMOS fabrication process and generally increase manufacturing cost. Therefore, there remains a need for a technique that increases the charge carrier mobility in the channel regions of FETs, thereby improving the performance of the FETS, and which is compatible with industry accepted FET manufacturing practices and packaging techniques.

SUMMARY OF THE INVENTION

In view of the foregoing, an embodiment of the invention provides a field effect transistor (FET) comprising a substrate; a buried oxide (BOX) layer over the substrate; a current channel region over the BOX layer; a high-stress film in the BOX layer; source/drain regions adjacent to the current channel region; and a gate electrode over the current channel region, wherein the high-stress film is adapted to create mechanical stress in the current channel region, and wherein the mechanical stress comprises any of compressive stress and tensile stress. Preferably, the substrate, the BOX layer, the current channel region, the high-stress film, and the gate electrode are arranged in any of a PFET configuration and a NFET configuration, wherein the compressive stress occurs in the PFET configuration, and the tensile stress occurs in the NFET configuration. Additionally, the high-stress film preferably comprises any of a compressive film and a tensile film, wherein the compressive film may comprise any of oxidized polysilicon, oxidized amorphous silicon, silicon nitride, and oxidized silicon germanium, and wherein the tensile film may comprise any of silicon nitride and silicon carbon. The FET may further comprise an insulating layer over the high-stress film. Preferably, the mechanical stress caused by the high-stress film causes an increased charge carrier mobility in the current channel region. Moreover, the high-stress film may extend into the substrate. Furthermore, the high-stress film is preferably adapted to stretch the current channel region in order to create the mechanical stress in the current channel region.

Another aspect of the invention provides a method of forming a field effect transistor (FET), wherein the method comprises forming a buried oxide (BOX) layer over a substrate; forming a current channel region over the BOX layer; forming a high-stress film in the BOX layer; configuring source/drain regions adjacent to the current channel region; and configuring a gate electrode over the current channel region, wherein the high-stress film creates mechanical stress in the current channel region. Preferably, the mechanical stress comprises any of compressive stress and tensile stress. The method may further comprise arranging the substrate, the BOX layer, the current channel region, the high-stress film, and the gate electrode in any of a PFET configuration and a NFET configuration, wherein the compressive stress occurs in the PFET configuration, and the tensile stress occurs in the NFET configuration. In the step of forming of the high-stress film, the high-stress film preferably comprises any of a compressive film and a tensile film, wherein the compressive film may comprise any of oxidized polysilicon, oxidized amorphous silicon, silicon nitride, and oxidized silicon germanium, and wherein the tensile film may comprise any of silicon nitride and silicon carbon. The method preferably further comprises forming an insulating layer over the high-stress film. Additionally, the mechanical stress caused by the high-stress film preferably causes an increased charge carrier mobility in the current channel region. Also, the method may further comprise etching a region of the substrate; and forming the high-stress film in the etched region of the substrate. Preferably, the high-stress film stretches the current channel region in order to create the mechanical stress in the current channel region. Furthermore, the forming of the high-stress film preferably comprises etching a region of the BOX layer; and depositing the high-stress film in the etched region of the BOX layer.

Another embodiment of the invention provides a method of increasing a charge carrier mobility in a field effect transistor (FET), wherein the method comprises placing a buried oxide (BOX) layer over a substrate; configuring a current channel region over the BOX layer; implanting each of a source region and a drain region adjacent to the current channel region; forming a high-stress film in the BOX layer, wherein the high-stress film creates mechanical stress in the current channel region; configuring a gate electrode over the current channel region; and applying a voltage to the source region, wherein the mechanical stress comprises any of compressive stress and tensile stress. The method may further comprise arranging the substrate, the BOX layer, the current channel region, the source region, the drain region, the high-stress film, and the gate electrode in any of a PFET configuration and a NFET configuration, wherein the compressive stress occurs in the PFET configuration, and the tensile stress occurs in the NFET configuration. Additionally, in the step of forming of the high-stress film, the high-stress film preferably comprises any of a compressive film and a tensile film, wherein the compressive film may comprise any of oxidized polysilicon, oxidized amorphous silicon, silicon nitride, and oxidized silicon germanium, and wherein the tensile film may comprise any of silicon nitride and silicon carbon. The method preferably further comprises forming insulating layer over the high-stress film. Preferably, the mechanical stress caused by the high-stress film causes an increased charge carrier mobility in the current channel region. Moreover, the high-stress film preferably stretches the current channel region in order to create the mechanical stress in the current channel region. Preferably, the forming of the high-stress film comprises etching a region of the BOX layer; and depositing the high-stress film in the etched region of the BOX layer. The method may further comprise etching a region of the substrate; and forming the high-stress film in the etched region of the substrate.

Another aspect of the invention provides a field effect transistor (FET) comprising a substrate; a buried oxide (BOX) layer over the substrate; a current channel region over the BOX layer; source/drain regions adjacent to the current channel region; a buried high-stress film in the BOX layer and regions of the substrate, wherein the high-stress film preferably comprises any of a compressive film and a tensile film; an insulating layer covering the buried high-stress film; and a gate electrode over the current channel region, wherein the high-stress film is preferably adapted to create mechanical stress in the current channel region, wherein the high-stress film is preferably adapted to stretch the current channel region in order to create the mechanical stress in the current channel region; wherein the mechanical stress preferably comprises any of compressive stress and tensile stress, and wherein the mechanical stress caused by the high-stress film preferably causes an increased charge carrier mobility in the current channel region.

These and other aspects of embodiments of the invention will be better appreciated and understood when considered in conjunction with the following description and the accompanying drawings. It should be understood, however, that the following description, while indicating preferred embodiments of the invention and numerous specific details thereof, is given by way of illustration and not of limitation. Many changes and modifications may be made within the scope of the embodiments of the invention without departing from the spirit thereof, and the embodiments of the invention include all such modifications.

BRIEF DESCRIPTION OF THE DRAWINGS

The embodiments of the invention will be better understood from the following detailed description with reference to the drawings, in which:

FIGS. 12(A) and 12(B) are flow diagrams illustrating preferred methods according to the embodiments of the invention.

DETAILED DESCRIPTION OF PREFERRED EMBODIMENTS OF THE INVENTION

Figure 1:
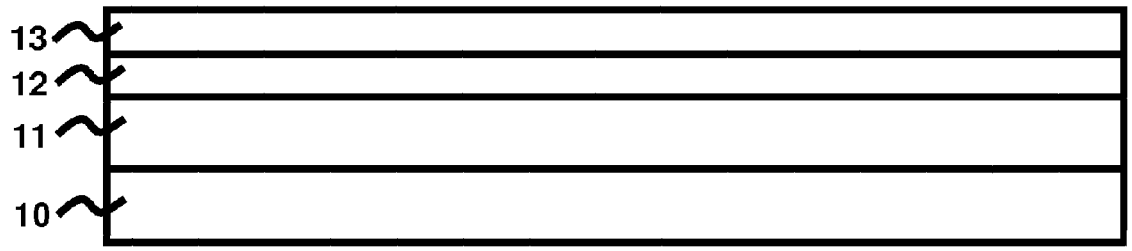
FIGS. 1 through 9 illustrate schematic diagrams of iterative steps for making a FET with a stressed channel according to an embodiment of the invention.

The embodiments of the invention and the various features and advantageous details thereof are explained more fully with reference to the non-limiting embodiments that are illustrated in the accompanying drawings and detailed in the following description. It should be noted that the features illustrated in the drawings are not necessarily drawn to scale. Descriptions of well-known components and processing techniques are omitted so as to not unnecessarily obscure the embodiments of the invention. The examples used herein are intended merely to facilitate an understanding of ways in which the embodiments of the invention may be practiced and to further enable those of skill in the art to practice the embodiments of the invention. Accordingly, the examples should not be construed as limiting the scope of the embodiments of the invention.

As mentioned, there remains a need for a technique that increases the charge carrier mobility in the channel regions of FETs, thereby improving the performance of the FETS, and which is compatible with industry accepted FET manufacturing practices and packaging techniques. The embodiments of the invention achieve this by providing NFET or PFET devices having stressed channel regions for enhanced carrier mobility, wherein the trench etch in the shallow trench isolation (STI) of the device is extended into the buried oxide layer (BOX). Then a compressive (tensile) film for enhanced PFET (NFET) performance is deposited. The high-stress film generates stress in the channel. Referring now to the drawings, and more particularly to FIGS. 1 through 12(B), there are shown preferred embodiments of the invention.

FIG. 1 illustrates a beginning structure for forming the FET device according to the embodiments of the invention. The beginning structure is well-known in the art for silicon-on-insulator (SOI) based FETs. A BOX layer 11 is formed over a substrate 10. Then, a silicon layer 12 is applied is applied over a BOX layer 11, whereby a portion of the silicon layer 12 eventually becomes the channel region 12'. A pad 13 is placed over the silicon layer 12, wherein the pad 13 preferably comprises silicon nitride and is approximately 80-90 nm thick. In another embodiment, the pad 13 may comprise oxide and nitride, wherein the oxide pad is approximately 8 nm thick and the nitride pad is approximately 80 nm thick. Moreover, the channel 12' may be made of any number of different types of materials other than silicon, including silicon-germanium or other semiconductor materials. The thickness of the BOX layer 11 can have a wide range; for example approximately 50-1000 nm. The substrate 10 preferably comprises silicon.

Figure 2:
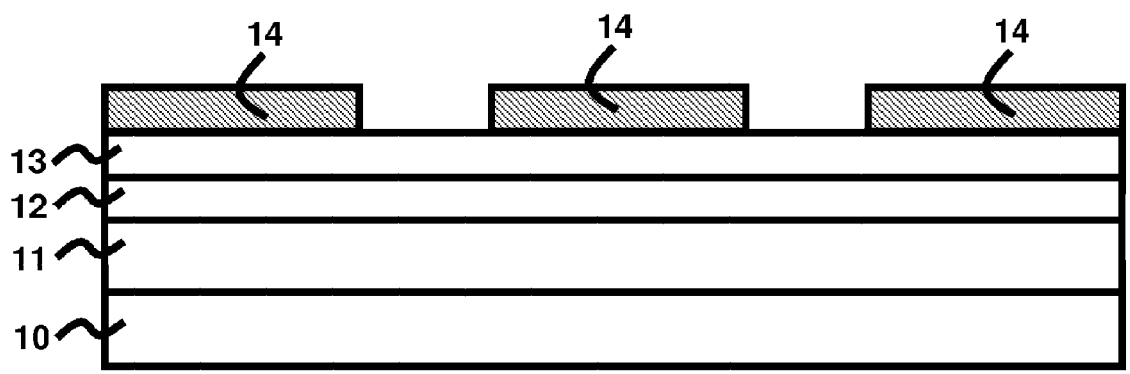
Figure 3:
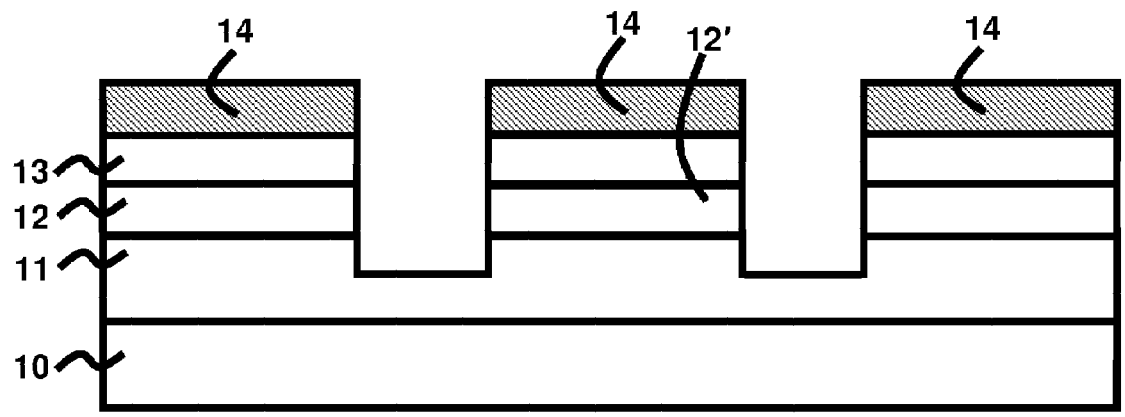

FIG. 2 shows a mask layer 14 deposited and patterned over the device. The mask 14 can be the same as that used for STI patterning. Moreover, the mask 14 may comprise a photoresist according to an embodiment of the invention. In FIG. 3, etching (for example, anisotropic plasma etching) is performed to etch through the pad 13, the channel 12', and a portion of the BOX layer 11. As a result of the etching, the width of the channel 12' is approximately less than 300 nm. The depth of the etched region in the BOX layer 11 can vary approximately from 50 nm to 200 nm. In one embodiment of the invention, the BOX layer 11 can be etched approximately 100 nm down into the BOX layer 11, and in another embodiment of the invention, the BOX layer 10 can be etched the entire way through to the underlying substrate 10.

Figure 4:
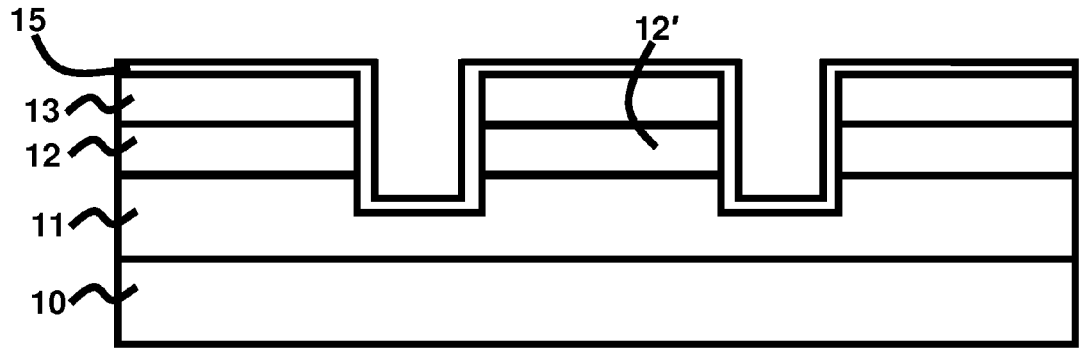
Figure 5:
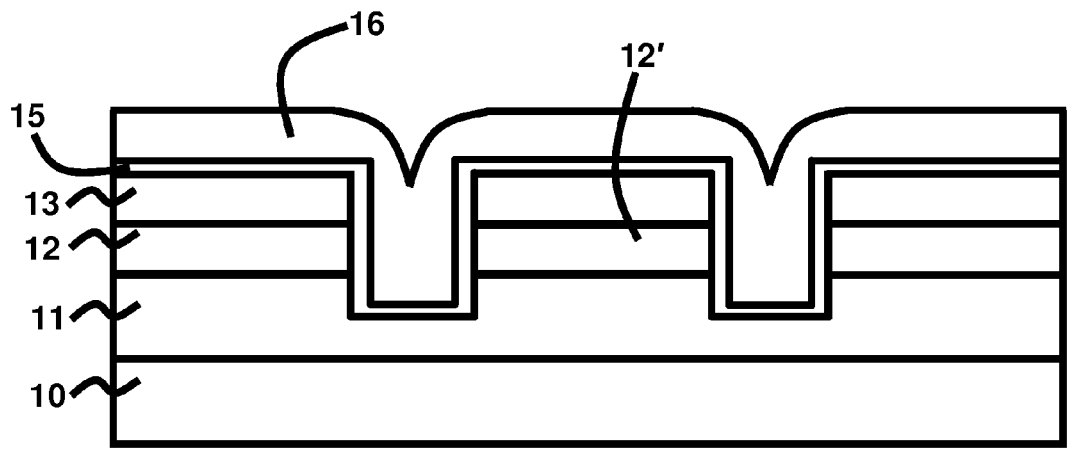

FIG. 4 illustrates an oxide liner film of approximate thickness of 8 nm being conformally deposited to form a spacer 15. The spacer 15 may comprise silicon dioxide or silicon nitride, for example. The material of the spacer 15 preferably has different etch properties from the material used to fill the etched region in the BOX layer 11. FIG. 5 shows a high-stress film 15 being deposited to fill the trench. Preferably, the high-stress film 15 is approximately 240 nm in thickness. Since the trench is deep and relatively difficult to fill because when the trench is deep and narrow, voids may be formed at the center of the trench during the filling process since the opening of the trench may be closed before the bottom portion is filled; accordingly, it is preferable to use a filling method with good conformality, such as low pressure chemical vapor deposition.

It is possible to deposit two different high-stress films selectively to specific regions. The process flow for forming the high-stress films can be as follows: (a) deposit high-stress film A on the entire wafer; (b) pattern a photoresist to cover specific areas where the high-stress film A should be preserved; (c) perform an etch (for example, either dry etch or wet etch) to remove the high-stress film A in the areas which are not covered by the photoresist; (d) strip the photoresist; and (e) deposit high-stress film B. Accordingly, one can deposit different high-stress films in different regions, wherein both compressive and tensile stresses can be achieved.

Figure 6:
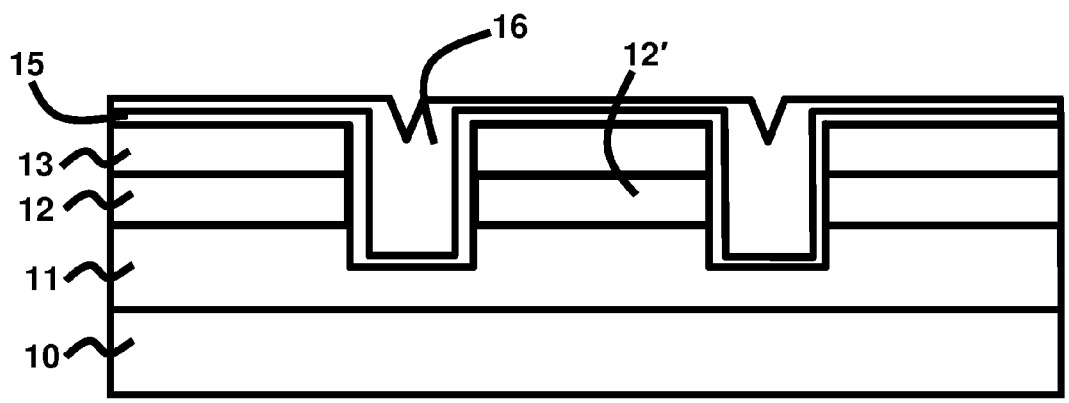
Figure 7:
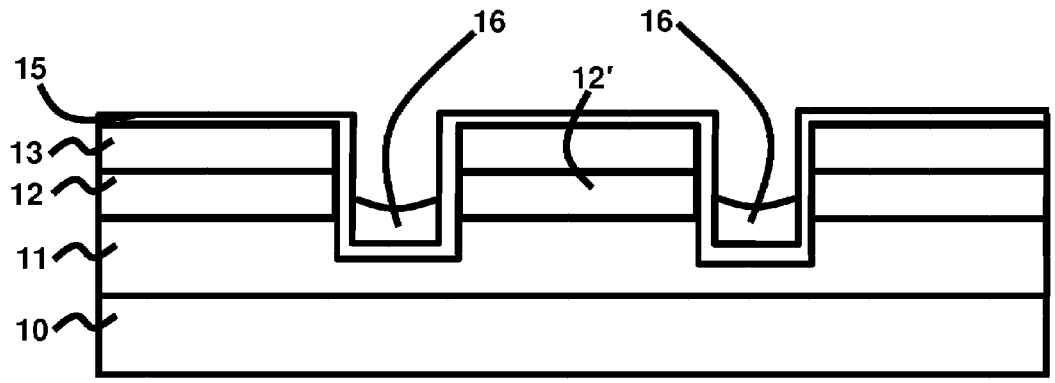
Figure 8:
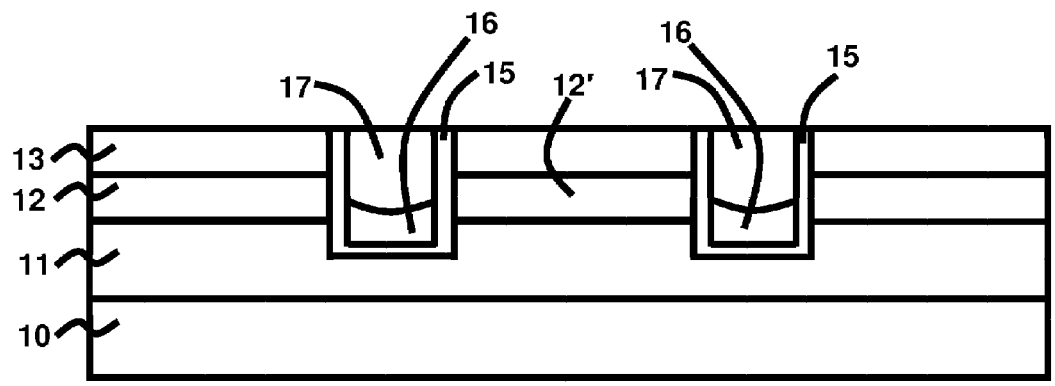

FIG. 6 illustrates a planarization process (for example, accomplished by a timed nitride chemical-mechanical polishing (CMP) process) being carried out to thin down the high-stress film 16 on top of the pad 13. This is intended to ensure all high-stress film 16 will be removed on pad 13 in the next step of the process. FIG. 7 depicts an isotropic etch (such as a nitride wet etch (for example, hot phosphoric acid etch)) process being performed to partially remove the high-stress film so that there is no high-stress film remaining on the pad 13. FIG. 8 shows an insulating material 17 such as an oxide being deposited (for example, using a high density plasma (HDP) oxide deposition process) and then planarized using, for example, a CMP process to a level planar with the pad 13. The high-stress film 16 is now buried under the insulating material 17. Accordingly, any adverse properties of the high-stress film will not be exposed to later processes, which allows for optimal material selection to achieve high-stress without affecting subsequent CMOS processes. In other words, the high-stress material may have a much faster etch rate. Thus, the STI material (insulating material 17) protects the high-stress material from being degraded in subsequent CMOS processes.

Figure 9:
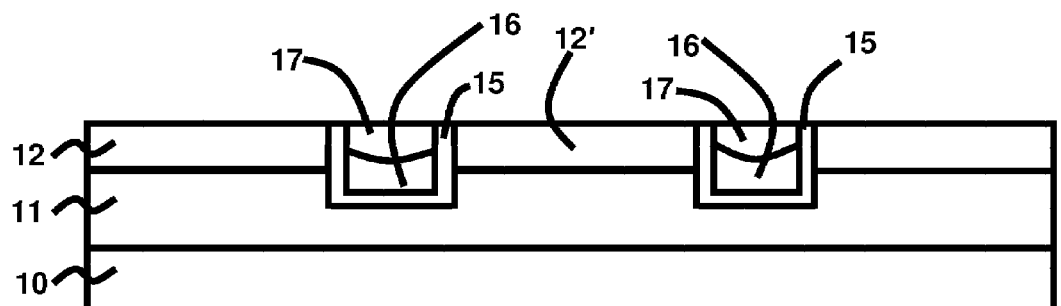
Figure 10:
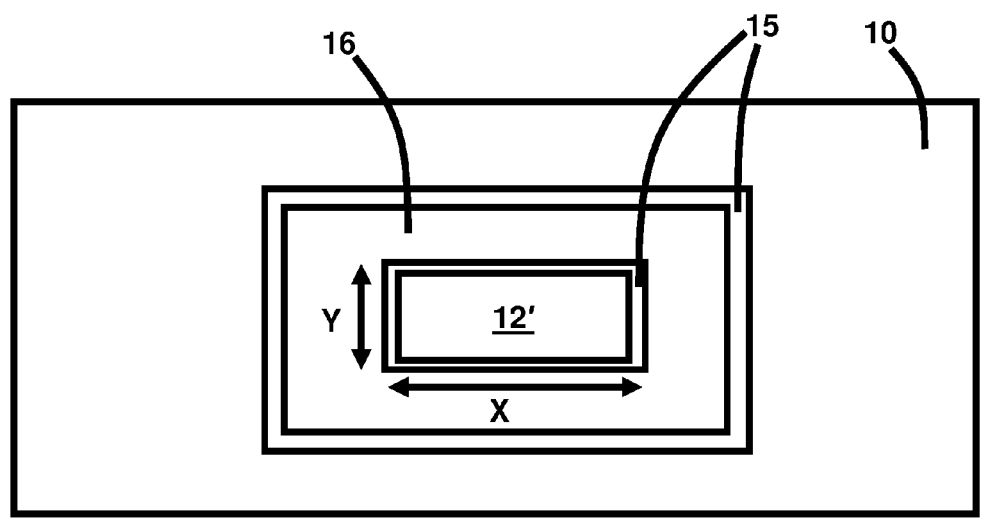
FIGS. 10 and 11 illustrate schematic diagrams of a FET according to an embodiment of the invention.

Next, the pad 13 is removed as indicated in FIG. 9. FIG. 10 illustrates a top-down view of the structure in FIG. 9. Because the stress generated in the channel region 12' by the buried high-stress material 16 depends on the dimension of the channel region 12', the stress level in a particular direction can be adjusted by changing the size of the channel region 12' in that direction. Therefore, the dimensions (X and Y as marked in FIG. 10) are stress-controlling parameters. For example, to achieve the same stress in both directions, namely, biaxial stress, X and Y should preferably be the same. In another example, where uniaxial stress is desirable in the X direction, Y can be designed to be far larger than X so that the stress in the Y direction is negligible.

Figure 11:
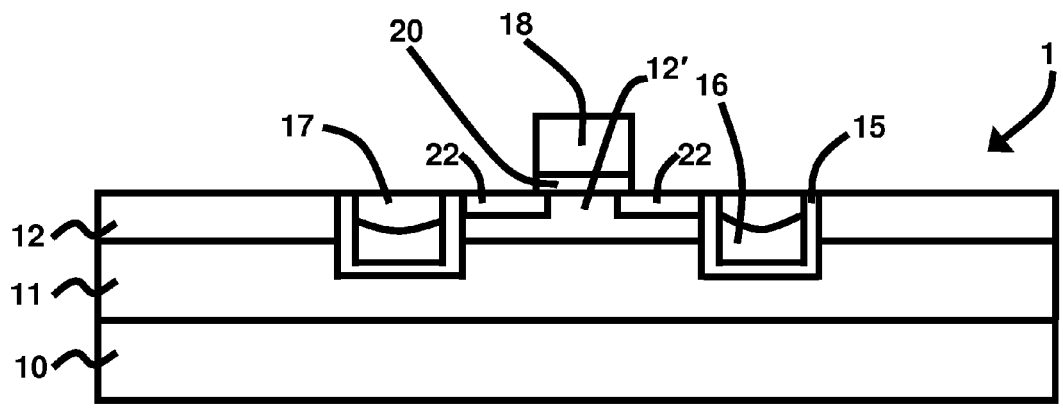

FIG. 11 illustrates a fabricated FET 1 including a gate dielectric 20 over the channel region 12', a gate electrode 18 over the gate dielectric 20, and source/drain regions 22 adjacent to the channel region 12'. The gate dielectric 20 and gate electrode 18 may be formed following standard CMOS possessing. According to the embodiments of the invention, the speed of FETs improves when the carrier mobility is enhanced by applying stress in the device's channel region 12'. Accordingly, the embodiments of the invention provides a technique of forming a buried high-stress isolation that comprises forming a recess in the BOX layer 11 and forming a high-stress material 16 in the recess to generate stress in the device's channel region 12'. The buried high-stress isolation is formed by etching into the buried oxide during STI patterning, and then refilling the trench with a high-stress material. The buried high-stress isolation region squeezes (pulls) the device channel region when the isolation is under compressive (tensile) stress, thereby causing compressive (tensile) stress in the channel 12'.

To enhance performance in PFET devices, the stress is compressive. Furthermore, to enhance performance in NFET devices, the stress is tensile. Preferably, the type of stress (compressive or tensile) is selected so that the transistor has an increased charge carrier mobility. Specifically, the stress should be compressive in a PFET transistor, and tensile in a NFET transistor. Moreover, the compressive film may comprise any of oxidized polysilicon, oxidized amorphous silicon, silicon nitride, oxidized SiGe, and other compressive films. Additionally, the tensile film may comprise any of silicon nitride and silicon carbon.

Figure 12B:
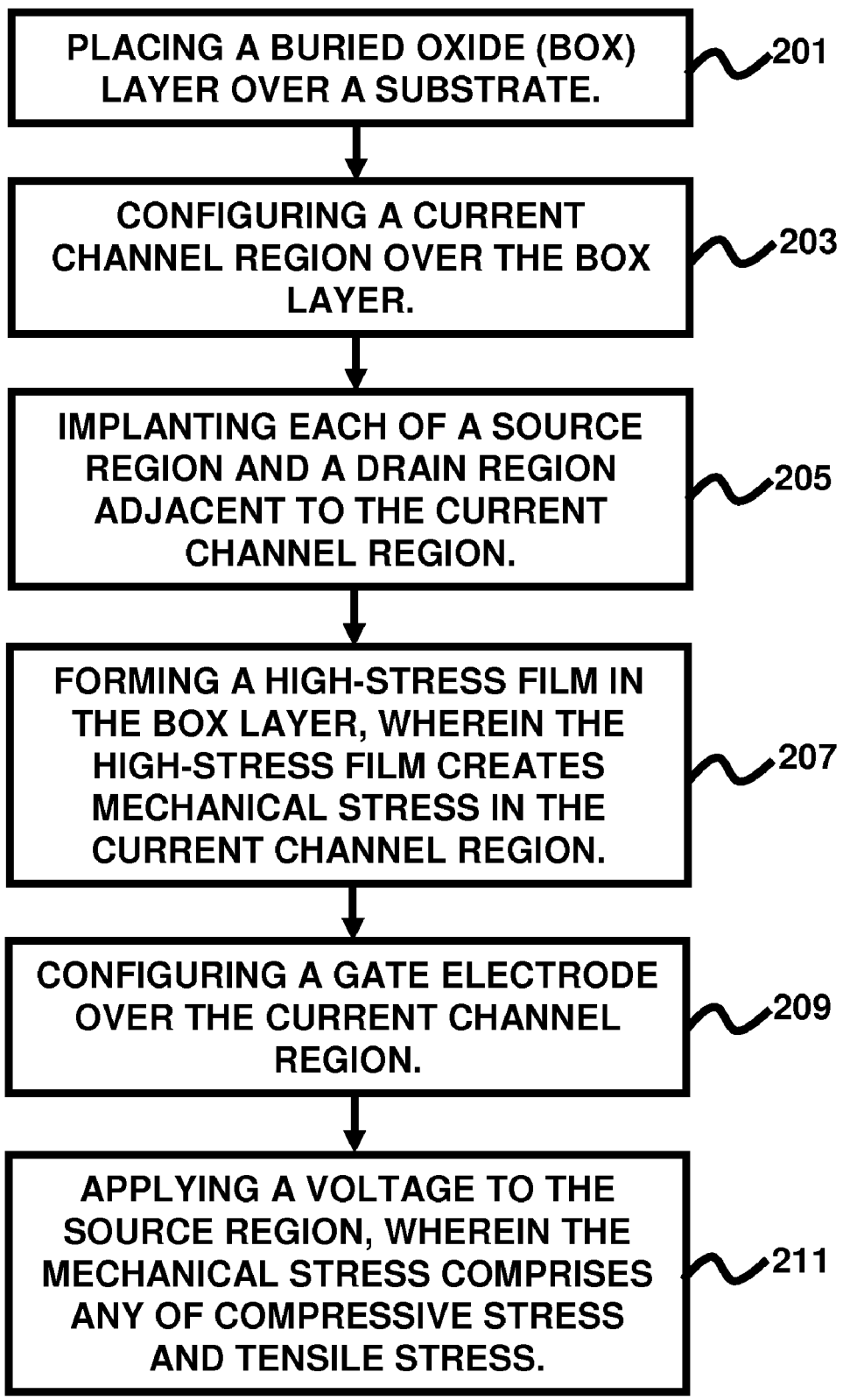

FIGS. 12(A) and 12(B), with reference to the structural components described in FIGS. 1 through 11, are flow diagrams illustrating preferred methods according to the embodiments of the invention. FIG. 12(A) illustrates a method of forming a field effect transistor (FET) 1, wherein the method comprises forming (101) a buried oxide (BOX) layer 11 over a substrate 10; forming (103) a current channel region 12' over the BOX layer 11; forming (105) a high-stress film 16 in the BOX layer 11; configuring (107) source/drain regions 22 adjacent to the current channel region 12'; and configuring (109) a gate electrode 18 over the current channel region 12', wherein the high-stress film 16 creates mechanical stress in the current channel region 12'.

Preferably, the mechanical stress comprises any of compressive stress and tensile stress. The method may further comprise arranging the substrate 10, the BOX layer 11, the current channel region 12', the high-stress film 16, and the gate electrode 18 in any of a PFET configuration and a NFET configuration, wherein the compressive stress occurs in the PFET configuration, and the tensile stress occurs in the NFET configuration. In the step of forming (105) of the high-stress film 16, the high-stress film 16 preferably comprises any of a compressive film and a tensile film, wherein the compressive film may comprise any of oxidized polysilicon, oxidized amorphous silicon, silicon nitride, and oxidized silicon germanium, and wherein the tensile film may comprise any of silicon nitride and silicon carbon.

The method preferably further comprises forming an insulating layer 17 over the high-stress film 16. Additionally, the mechanical stress caused by the high-stress film 16 preferably causes an increased charge carrier mobility in the current channel region 12'. Also, the method may further comprise etching a region of the substrate 10; and forming the high-stress film 16 in the etched region (not shown) of the substrate 10. Preferably, the high-stress film 16 stretches the current channel region 12' in order to create the mechanical stress in the current channel region 12'. Furthermore, the forming (105) of the high-stress film 16 preferably comprises etching a region of the BOX layer 11; and depositing the high-stress film 16 in the etched region of the BOX layer 11.

FIG. 12(B) illustrates a method of increasing a charge carrier mobility in a field effect transistor (FET) 1, wherein the method comprises placing (201) a buried oxide (BOX) layer 11 over a substrate 10; configuring (203) a current channel region 12' over the BOX layer 11; implanting (205) each of a source region and a drain region 22 adjacent to the current channel region 12'; forming (207) a high-stress film 16 in the BOX layer 11, wherein the high-stress film 16 creates mechanical stress in the current channel region 12'; configuring (209) a gate electrode 18 over the current channel region 12'; and applying (211) a voltage to the source region 22, wherein the mechanical stress comprises any of compressive stress and tensile stress.

The several embodiments of the invention can be formed into integrated circuit chips. The resulting integrated circuit chips can be distributed by the fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other higher level carrier) or in a multichip package (such as a ceramic carrier that has either or both surface interconnections or buried interconnections). In any case the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

Generally, the embodiments of the invention include a FET device 1 and method for making a FET 1 with stress in the channel 12'. The method includes removing part of the BOX layer 11, and then forming a high-stress film 16 in the etched area of the BOX layer 11. The high-stress film 16 pushes (stretches) the channel 12', thereby creating compressive (tensile) stress in the channel 12'.

The foregoing description of the specific embodiments will so fully reveal the general nature of the embodiments of the invention that others can, by applying current knowledge, readily modify and/or adapt for various applications such specific embodiments without departing from the generic concept, and, therefore, such adaptations and modifications should and are intended to be comprehended within the meaning and range of equivalents of the disclosed embodiments. It is to be understood that the phraseology or terminology employed herein is for the purpose of description and not of limitation. Therefore, while the embodiments of the invention has been described in terms of preferred embodiments, those skilled in the art will recognize that the embodiments of the invention can be practiced with modification within the spirit and scope of the appended claims.

What is claimed is:

1. A field effect transistor (FET) comprising:
   a substrate;
   a buried oxide (BOX) layer over said substrate;
   a current channel region over said BOX layer;
   a high-stress film in said BOX layer;
   source/drain regions adjacent to said current channel region and adjacent to said high-stress film; and
   a gate electrode over said current channel region,
   wherein said high-stress film is adapted to create mechanical stress in said current channel region.

2. The FET of claim 1, wherein said mechanical stress comprises one of compressive stress and tensile stress.

3. The FET of claim 2, wherein said substrate, said BOX layer, said current channel region, said high-stress film, and said gate electrode are arranged in one of a PFET configuration and a NFET configuration, wherein said compressive stress occurs in said PFET configuration, and said tensile stress occurs in said NFET configuration.

4. The FET of claim 1, wherein said high-stress film comprises one of a compressive film and a tensile film.

5. The FET of claim 4, wherein said compressive film comprises one of oxidized polysilicon, oxidized amorphous silicon, silicon nitride, and oxidized silicon germanium, and wherein said tensile film comprises one of silicon nitride and silicon carbon.

6. The FET of claim 1, further comprising an insulating layer over said high-stress film.

7. The FET of claim 1, wherein said mechanical stress caused by said high-stress film causes an increased charge carrier mobility in said current channel region.

8. The FET of claim 1, wherein said high-stress film extends into said substrate.

9. The FET of claim 1, wherein said high-stress film is adapted to stretch said current channel region in order to create said mechanical stress in said current channel region.

10. A method of forming a field effect transistor (FET), said method comprising:
    forming a buried oxide (BOX) layer over a substrate;
    forming a current channel region over said BOX layer;
    depositing a high-stress film in said BOX layer;
    configuring source/drain regions adjacent to said current channel region and adjacent to said high-stress film; and
    configuring a gate electrode over said current channel region,
    wherein said high-stress film creates mechanical stress in said current channel region.

11. The method of claim 10, wherein said mechanical stress comprises one of compressive stress and tensile stress.

12. The method of claim 11, further comprising arranging said substrate, said BOX layer, said current channel region, said high-stress film, and said gate electrode in one of a PFET configuration and a NFET configuration, wherein said compressive stress occurs in said PFET configuration, and said tensile stress occurs in said NFET configuration.

13. The method of claim 10, wherein in said forming of said high-stress film, said high-stress film comprises one of a compressive film and a tensile film.

14. The method of claim 10, wherein said mechanical stress caused by said high-stress film causes an increased charge carrier mobility in said current channel region.

15. The method of claim 10, further comprising:
    etching a region of said substrate; and
    forming said high-stress film in the etched region of said substrate.

16. The method of claim 10, wherein said high-stress film stretches said current channel region in order to create said mechanical stress in said current channel region.

17. The method of claim 10, wherein said forming of said high-stress film comprises: etching a region of said BOX layer; and
    depositing said high-stress film in the etched region of said BOX layer.

18. A method of increasing a charge carrier mobility in a field effect transistor (FET), said method comprising:
    placing a buried oxide (BOX) layer over a substrate;
    configuring a current channel region over said BOX layer;
    implanting each of a source region and a drain region adjacent to said current channel region;
    depositing a high-stress film in said BOX layer adjacent to said source and drain regions, wherein said high-stress film creates mechanical stress in said current channel region;
    configuring a gate electrode over said current channel region; and
    applying a voltage to said source region.

19. The method of claim 18, wherein said mechanical stress comprises one of compressive stress and tensile stress.

20. The method of claim 19, further comprising arranging said substrate, said BOX layer, said current channel region, said source region, said drain region, said high-stress film, and said gate electrode in one of a PFET configuration and a NFET configuration, wherein said compressive stress occurs in said PFET configuration, and said tensile stress occurs in said NFET configuration.

21. The method of claim 18, wherein in said forming of said high-stress film, said high-stress film comprises one of a compressive film and a tensile film.

22. The method of claim 18, wherein said mechanical stress caused by said high-stress film causes an increased charge carrier mobility in said current channel region.

23. The method of claim 18, wherein said high-stress film stretches said current channel region in order to create said mechanical stress in said current channel region.

24. The method of claim 18, wherein said forming of said high-stress film comprises: etching a region of said BOX layer; and depositing said high-stress film in the etched region of said BOX layer.

25. The method of claim 18, further comprising:
etching a region of said substrate; and
forming said high-stress film in the etched region of said substrate.

26. A field effect transistor (FET) comprising:
a substrate;
a buried oxide (BOX) layer over said substrate;
a current channel region over said BOX layer;
source/drain regions adjacent to said current channel region;
a buried high-stress film in said BOX layer and regions of said substrate adjacent to said source/drain regions,
wherein said high-stress film comprises one of a compressive film and a tensile film;
an insulating layer covering said buried high-stress film; and
a gate electrode over said current channel region,
wherein said high-stress film is adapted to create mechanical stress in said current channel region,
wherein said high-stress film is adapted to stretch said current channel region in order to create said mechanical stress in said current channel region;
wherein said mechanical stress comprises one of compressive stress and tensile stress, and
wherein said mechanical stress caused by said high-stress film causes an increased charge carrier mobility in said current channel region.

* * * * *